United States Patent
Zhu

(10) Patent No.: US 12,268,024 B2
(45) Date of Patent: Apr. 1, 2025

(54) SEMICONDUCTOR DEVICE AND METHOD OF MANUFACTURING THE SAME, AND ELECTRONIC APPARATUS INCLUDING THE SEMICONDUCTOR DEVICE

(71) Applicant: Institute of Microelectronics, Chinese Academy of Sciences, Beijing (CN)

(72) Inventor: Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 353 days.

(21) Appl. No.: 17/754,287

(22) PCT Filed: Oct. 29, 2020

(86) PCT No.: PCT/CN2020/124741
§ 371 (c)(1),
(2) Date: Mar. 29, 2022

(87) PCT Pub. No.: WO2021/103910
PCT Pub. Date: Jun. 3, 2021

(65) Prior Publication Data
US 2022/0328628 A1    Oct. 13, 2022

(30) Foreign Application Priority Data

Nov. 29, 2019   (CN) .......................... 201911209907.8

(51) Int. Cl.
| | | |
|---|---|---|
| *H10D 30/01* | (2025.01) | |
| *H10D 30/43* | (2025.01) | |
| *H10D 30/67* | (2025.01) | |
| *H10D 62/10* | (2025.01) | |
| *H10D 64/01* | (2025.01) | |
| *H10D 84/01* | (2025.01) | |
| *H10D 84/03* | (2025.01) | |

(52) U.S. Cl.
CPC ......... *H10D 62/121* (2025.01); *H10D 30/014* (2025.01); *H10D 30/43* (2025.01);
(Continued)

(58) Field of Classification Search
CPC ......... H01L 29/0673; H01L 21/823412; H01L 21/823418; H01L 21/823468;
(Continued)

(56) References Cited

U.S. PATENT DOCUMENTS

2015/0162433 A1* 6/2015 Loubet ................ H01L 29/1083
257/66
2016/0172498 A1   6/2016 Cheng et al.
(Continued)

FOREIGN PATENT DOCUMENTS

| CN | 102664189 A | 9/2012 |
|---|---|---|
| CN | 106206315 A | 12/2016 |

(Continued)

OTHER PUBLICATIONS

"Chinese Application Serial No. 201911209907.8, Office Action dated Feb. 3, 2021", w/ English Translation, (Feb. 3, 2021), 23 pgs.
(Continued)

*Primary Examiner* — S M Sohel Imtiaz
(74) *Attorney, Agent, or Firm* — Schwegman Lundberg & Woessner, P.A.

(57) ABSTRACT

The present disclosure provides a semiconductor device and a method of manufacturing the same thereof, and an electronic apparatus including the semiconductor device. According to embodiments of the present disclosure, the semiconductor device includes a channel portion, source/drain portions connected to the channel portion on two opposite sides of the channel portion, and a gate stack intersecting with the channel portion. The channel portion includes a first portion extending in a vertical direction with respect to a substrate and a second portion extending from the first portion to two opposite sides in a lateral direction with respect to the substrate, respectively.

15 Claims, 19 Drawing Sheets

(52) U.S. Cl.
CPC ..... *H10D 30/6713* (2025.01); *H10D 30/6757* (2025.01); *H10D 64/021* (2025.01); *H10D 84/0128* (2025.01); *H10D 84/013* (2025.01); *H10D 84/0147* (2025.01); *H10D 84/0151* (2025.01); *H10D 84/038* (2025.01)

(58) Field of Classification Search
CPC ....... H01L 21/823481; H01L 29/66439; H01L 29/6656; H01L 29/775; H01L 29/78618; H01L 29/78696; H01L 29/66545; H10D 62/121; H10D 30/014; H10D 30/43; H10D 30/6713; H10D 30/6757; H10D 64/021; H10D 84/0128; H10D 84/013; H10D 84/0147; H10D 84/0151; H10D 84/038; H10D 64/252; H02K 15/027; H10H 20/826

See application file for complete search history.

(56) References Cited

U.S. PATENT DOCUMENTS

| | | | |
|---|---|---|---|
| 2016/0211377 | A1 | 7/2016 | Cheng et al. |
| 2017/0301778 | A1* | 10/2017 | Chang ................... H01L 29/045 |
| 2019/0067122 | A1* | 2/2019 | Cheng ............. H01L 21/823807 |
| 2020/0006578 | A1* | 1/2020 | Moroz ................. H01L 29/7853 |
| 2020/0111781 | A1* | 4/2020 | Kim ..................... H01L 29/6656 |
| 2020/0219970 | A1* | 7/2020 | Mannebach ...... H01L 29/66439 |
| 2022/0336453 | A1* | 10/2022 | Ju ..................... H01L 29/66439 |

FOREIGN PATENT DOCUMENTS

| | | |
|---|---|---|
| CN | 107735864 A | 2/2018 |
| CN | 109273363 A | 1/2019 |
| CN | 109801913 A | 5/2019 |
| CN | 110189997 A | 8/2019 |
| CN | 111106176 A | 5/2020 |

OTHER PUBLICATIONS

"International Application Serial No. PCT/CN2020/124741, International Search Report dated Jan. 27, 2021", w/ English Translation, (Jan. 27, 2021), 5 pgs.

"International Application Serial No. PCT/CN2020/124741, Written Opinion dated Jan. 27, 2021", (Jan. 27, 2021), 4 pgs.

* cited by examiner

SEMICONDUCTOR DEVICE AND METHOD OF MANUFACTURING THE SAME, AND ELECTRONIC APPARATUS INCLUDING THE SEMICONDUCTOR DEVICE

CROSS-REFERENCE TO RELATED APPLICATION

This application is a U.S. National Stage Filing under 35 U.S.C. § 371 from International Application No. PCT/CN2020/124741, filed on Oct. 29, 2020, and published as WO2021/103910 on Jun. 3, 2021, which claims the benefit of priority to the Chinese Patent Application No. 201911209907.8 entitled "SEMICONDUCTOR DEVICE AND MANUFACTURING METHOD THEREOF, AND ELECTRONIC DEVICE COMPRISING SEMICONDUCTOR DEVICE" filed on Nov. 29, 2019; the benefit of priority of each of which is hereby claimed herein, and which applications and publication are hereby incorporated herein by reference in their entireties.

TECHNICAL FIELD

The present disclosure relates to a field of semiconductor, and in particular to a semiconductor device having a tree-shaped channel structure and a method of manufacturing the same, and an electronic apparatus including the semiconductor device.

BACKGROUND

Various structures, such as fin field effect transistors (FinFET) and multi-bridge channel field effect transistors (MBCFET), have been proposed to meet the challenge of further miniaturization of semiconductor devices. For the FinFET, as the FinFET is further miniaturized, the heights of the fin may be higher so as to gain enough drive current while saving the area. However, if the height of the fin is too high, it may cause many problems, such as fin collapse, gap filling, etch profile control, or the like. For the MBCFET, for the purpose of metal gate filling, the gap between nanosheets included therein cannot be further reduced, and the self-heating problem becomes serious. In addition, unlike the FinFET, the height of the MBCFET cannot be used to enhance device performance.

SUMMARY

In view of this, objectives of the present disclosure are at least partly to provide a semiconductor device and a method of manufacturing the same, and an electronic apparatus including the semiconductor device, so as to obtain reliable performance when the device is further reduced.

According to an aspect of the present disclosure, there is provided a semiconductor device, including a channel portion, source/drain portions connected to the channel portion on two opposite sides of the channel portion, and a gate stack intersecting with the channel portion. The channel portion includes a first portion extending in a vertical direction with respect to a substrate and a second portion extending from the first portion to two opposite sides of the first portion in a lateral direction with respect to the substrate, respectively.

According to another aspect of the present disclosure, there is provided a method of manufacturing a semiconductor device, including: providing, on a substrate, a first sacrificial layer for an isolation layer; providing, on the first sacrificial layer, an alternately stacked layer including at least one second sacrificial layer for a gate stack and at least one first active layer; forming a linear trench in the first sacrificial layer and the stacked layer, wherein the trench exposes a surface of the substrate; forming a filling portion on the surface of the substrate in the trench, wherein the filling portion comprises, at least in an upper part, a second active layer connected to the first active layer; patterning the filling portion formed in the trench in the stacked layer and the stacked layer into a ridge-like structure extending in a first direction on the substrate; removing the first sacrificial layer; forming the isolation layer around the filling portion under the ridge structure on the substrate; removing the second sacrificial layer; forming the gate stack on the isolation layer, wherein the gate stack extends in the second direction to intersect with the first active layer and the second active layer; removing parts of the first active layer and the second active layer exposed by the gate stack; and forming source/drain portions on two sides of the gate stack in the first direction on the substrate, wherein the source/drain portions are connected to the first active layer and the second active layer.

According to another aspect of the present disclosure, there is provided an electronic apparatus including the above-mentioned semiconductor device.

BRIEF DESCRIPTION OF THE DRAWINGS

The above and other objectives, features and advantages of the present disclosure will be more apparent through the following descriptions of embodiments of the present disclosure with reference to the drawings, in which:

FIGS. 1 to 19(b) show schematic diagrams of some stages in a process of manufacturing a semiconductor device according to the embodiments of the present disclosure, in which FIGS. 1 to 6, 7(a), 7(b), 8(a), 8(b), 9, 10, 11(b), 16(a), 17(a), 18(a), 19(a) are cross-sectional views taken along line AA', FIGS. 11(c), 12(a), 13(b), 16(b), 17(b), 18(b), 19(b) are cross-sectional views taken along line BB', FIGS. 11(d), 12(b), 13(c), 14(a), 15, 16(c), 17(c), 18(c) are cross-sectional views taken along line CC'.

Throughout the drawings, the same or similar reference numerals indicate the same or similar components.

DETAILED DESCRIPTION OF EMBODIMENTS

Figure 1:
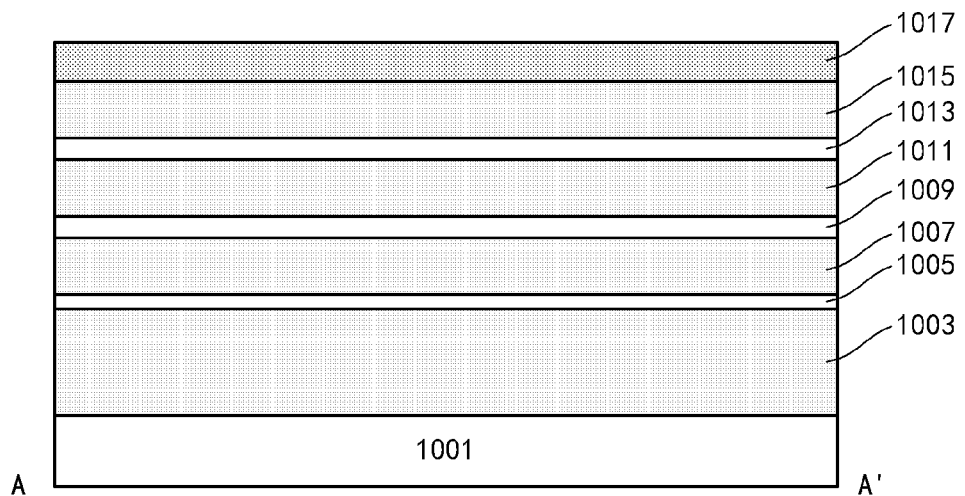

The embodiments of the present disclosure will be described below with reference to the drawings. It should be understood, however, that these descriptions are merely exemplary and are not intended to limit the scope of the present disclosure. In addition, in the following descriptions, descriptions of well-known structures and technologies are omitted to avoid unnecessarily obscuring the concept of the present disclosure.

Various schematic structural diagrams according to the embodiments of the present disclosure are shown in the drawings. The drawings are not drawn to scale. Some details are enlarged and some details may be omitted for clarity of presentation. Shapes of various regions and layers shown in the drawings, as well as relative size and positional relationship thereof, are only exemplary. In practice, there may be deviations due to manufacturing tolerances or technical limitations, and those skilled in the art may additionally design regions/layers with different shapes, sizes and relative positions according to actual needs.

In the context of the present disclosure, when a layer/element is referred to as being "on" another layer/element, the layer/element may be directly on the another layer/element, or there may be an intermediate layer/element between them. In addition, if a layer/element is located "on" another layer/element in one orientation, the layer/element may be located "under" the another layer/element when the orientation is reversed.

According to the embodiments of the present disclosure, a semiconductor device having a tree-shaped channel structure is proposed. For example, a channel portion of the semiconductor device may include a first portion extending in a vertical direction with respect to a substrate (for example, in a direction substantially perpendicular to a surface of the substrate) and a second portion extending from the first portion in a lateral direction with respect to the substrate (for example, a direction approximately parallel to the surface of the substrate). The second portion may be spaced apart from the substrate. The channel portion may include a plurality of such second portions that are spaced apart in the vertical direction. (Each of) the second portion may extend from the first portion toward two opposite sides of the first portion. Accordingly, the channel portion may be tree-shaped as a whole. The second portions on two sides of the first portion may present in pairs. At least one or even all of the second portions on one side of the first portion may be substantially coplanar with corresponding second portion(s) on the other side. A top surface of the first portion may be higher than a top surface of an uppermost second portion. The first portion may be connected to the substrate through a semiconductor that may be doped to form a punch through stopper (PTS). The semiconductor may have a reduced thickness relative to the first portion at least in a lower part thereof. The first portion of the channel portion may be similar to a fin in a fin field effect transistor (FinFET), and the second portion of the channel portion may be similar to a nano-sheet in a nano-sheet field effect transistor (FET) or a multi-bridge channel field effect transistor (MBCFET).

Therefore, the semiconductor device according to the embodiments of the present disclosure may have the advantages of both the FinFET and the nano-sheet FET or MBCFET. In the semiconductor device, a current driving capability may be provided by both the first portion and the second portion of the channel portion, so that a device performance may be improved and an area may be saved. Moreover, since the fin may be connected to the substrate, a heat dissipation performance may be better than a heat dissipation performance of the MBCFET.

The semiconductor device may further include source/drain portions provided on two opposite sides of the channel portion. The source/drain portions are connected to the channel portion to form an active region of the semiconductor device. A longitudinal direction of the active region may be along the first direction. The source/drain portions may contain the same material as the channel portion, or may contain a different material so as to, for example, apply stress to the channel portion to enhance the device performance. The source/drain portions may be grown from sidewalls of the channel portion. A top surface of the source/drain portions may be higher than a top surface of the channel portion.

The first portion and/or the second portion of the channel portion may contain a single crystal semiconductor material so as to improve the device performance. For example, the first portion and/or the second portion of the channel portion may be formed by epitaxial growth, and thus their thicknesses may be better controlled. Certainly, the source/drain portions may also contain a single crystal semiconductor material. A crystal interface may exist between at least some of the semiconductor layers grown separately. For example, an observable crystal interface may exist at least between the first portion of the channel portion and the source/drain portions, between the second portion of the channel portion and the source/drain portions, or between the first portion and the second portion of the channel portion.

The semiconductor device may further include a gate stack intersecting with the channel portion. The gate stack may extend in a second direction intersecting with (for example, perpendicular to) the first direction, from one side of the channel portion to the other side across the channel portion. The gate stack may enter a gap between each second portion (in the case of a plurality of second portions) of the channel portion and a gap between the lowermost second portion and the substrate. Therefore, the gate stack may be in contact with the opposite sidewalls and the top surface of the first portion of the channel portion, and an upper and a lower surface and sidewalls of each second portion, and define a channel region therein.

Spacers may be formed on sidewalls at two opposite sides of the gate stack in the first direction. The gate stack may be separated from the source/drain portions by the spacers. Sidewalls of the spacers facing each of the source/drain portions may be substantially coplanar in the vertical direction. The spacers may include a first portion extending on two sides of the channel portion and on the uppermost second portion of the channel portion, and a second portion extending between each second portion (in the case of a plurality of second portions) of the channel portion and between the lowermost second portion of the channel portion and the substrate. The first portion and the second portion of the spacers may contain different materials. The first portion and the second portion of the spacers may have substantially a same thickness.

The semiconductor device may be manufactured as follows, for example.

First, a tree-shaped channel portion may be provided on the substrate.

For example, a first sacrificial layer may be formed on the substrate, and the first sacrificial layer may define a position of an isolation layer. An alternately stacked layer of at least one second sacrificial layer and at least one first active layer may be formed on the first sacrificial layer. These layers may be formed by epitaxial growth. The first active layer may be used to form the second portion of the channel portion, and the second sacrificial layer may be used to define a gap (in which the gate stack may be subsequently formed) between the second portion and the isolation layer and between each second portion (in the case of a plurality of second portions). An uppermost layer of the stacked layer may be the second sacrificial layer so as to ensure a contact between a second active layer subsequently formed and each first active layer, especially an uppermost first active layer.

A linear trench may be formed in a ridge-like structure. The trench may extend vertically to pass through each of the first active layer (and the second sacrificial layer). In addition, the trench may further pass through the first sacrificial layer to extend to the substrate, so that a filling portion subsequently formed therein may be connected to the substrate to support in a subsequent process. The filling portion may be formed in the trench. The filling portion includes, at least in an upper part, the second active layer connected to the first active layer. In order to suppress leakage current, a bottom of the filling portion may include a punch through stopper (PTS). For example, the filling portion may be formed by epitaxially growing a semiconductor layer from the substrate and sidewalls of the trench. In the case of forming the PTS, a growth of the PTS and a growth of the second active layer may be performed sequentially. The second active layer may extend vertically in the trench and may be formed as a fin.

The stacked layer may be patterned into a ridge-like structure extending in the first direction. The ridge-like structure may include, based on the trench (with the filling portion formed therein), two portions on two sides of the trench. In this way, the first active layer in the stacked layer may be formed as a nano-sheet. In addition, the first sacrificial layer may be partially exposed. The first sacrificial layer may be removed. Due to an existence of the filling portion, the ridge-like structure may be supported. The isolation layer may be formed on the substrate. The isolation layer may fill a part under the ridge-like structure (to thereby surrounding the filling portion) and expose the ridge structure. The second sacrificial layer may be removed. In this way, the first active layer and the second active layer form a tree-shaped structure.

The manufacture of the semiconductor device may continue on the basis of the tree-shaped structure obtained.

As described above, the tree-shaped structure is used for the channel portion. A definition of the channel portion may be combined with a formation of the gate stack. For example, a gate stack extending in the second direction so as to intersect with the first active layer and the second active layer may be formed on the isolation layer. The gate stack may be used as a mask to pattern the tree-shaped structure, leaving it under the gate stack to form the channel portion. The exposed portions on two sides of the gate stack may be removed. On two sides of the gate stack in the first direction on the substrate, the source/drain portions connected to the first active layer and the second active layer may be formed by, for example, epitaxial growth.

The gate stack formed above may be a sacrificial gate stack, which may be replaced with a real gate stack through a replacement gate process.

The present disclosure may be presented in various forms, some examples of which will be described below. In the following descriptions, a selection of various materials is involved. In the selection of materials, in addition to functions of the materials (for example, a semiconductor material used to form the active region and a dielectric material used to form electrical isolation), etching selectivity is also taken into account. In the following descriptions, a required etching selectivity may or may not be indicated. It should be clear to those skilled in the art that when it is mentioned below to etch a certain material layer, if etching of other layers is not mentioned or shown, this etching may be selective, and the material layer may have etching selectivity relative to other layers exposed to a same etching recipe.

FIGS. 1 to 19(*b*) show schematic diagrams of some stages in a process of manufacturing a vertical semiconductor device according to the embodiments of the present disclosure.

As shown in FIG. 1, a substrate 1001 is provided. The substrate 1001 may be a substrate of various forms, including but not limited to a bulk semiconductor material substrate such as a bulk Si substrate, a semiconductor-on-insulator (SOI) substrate, a compound semiconductor substrate such as a SiGe substrate, and the like. In the following descriptions, for ease of description, a bulk Si substrate is illustrated by way of example.

A well region (not shown) may be formed in the substrate 1001. If a p-type device is to be formed, the well region may be an n-type well, and if an n-type device is to be formed, the well region may be a p-type well. The well region may be formed by, for example, injecting dopants of corresponding conductivity types (a p-type dopant such as B or In, or an n-type dopant such as As or P) into the substrate 1001 and then performing thermal annealing. There are many ways in the art to provide such well region, which will not be repeated here.

A first sacrificial layer 1003 may be formed on the substrate 1001, for example, by epitaxial growth. The first sacrificial layer 1003 may then be used to define an isolation portion and have a thickness of, for example, about 10 nm-30 nm. In addition, for a better etching control, an etch stop layer 1005 may be formed on the first sacrificial layer 1003 by, for example, epitaxial growth. The etch stop layer 1005 may be relatively thin with a thickness of, for example, about 2 nm-5 nm. On the etch stop layer 1005, an alternately stacked layer of second sacrificial layers 1007, 1011, 1015 and first active layers 1009, 1013 may be formed by, for example, epitaxial growth. The first active layers 1009, 1013 may then form nano-sheets of a channel portion and have a thickness of, for example, about 5 nm-15 nm. When the first active layers 1009, 1013 are formed, in-situ doping may be performed to adjust a device threshold. The second sacrificial layers 1007 and 1011 may define a gap between the nano-sheets and have a thickness of, for example, about 10 nm-25 nm. An uppermost second sacrificial layer 1015 may be slightly thinner with a thickness of, for example, about 10 nm-20 nm. The number of the second sacrificial layers and the first active layers in the alternately stacked layer may be changed to more or less according to a device design.

The substrate 1001 and adjacent layers of the above-mentioned layers formed thereon may have etching selectivity with respect to each other. For example, the first sacrificial layer 1003 and the second sacrificial layers 1007, 1011, 1015 may contain SiGe (for example, Ge atomic percentage is about 10%-30%), and the etch stop layer 1005 and the first active layers 1009, 1013 may contain Si.

A hard mask layer 1017 may be formed on the above stacked layer by, for example, deposition. For example, the hard mask layer 1017 may contain nitride (for example, silicon nitride) and have a thickness of about 30 nm-150 nm. Before depositing the hard mask layer 1017 of nitride, a thin etch stop layer or protection layer (not shown) of oxide (for example, silicon oxide) or other materials may be formed by, for example, deposition. Alternatively, the hard mask layer 1017 may contain oxide or SiC, and the like.

Figure 2:
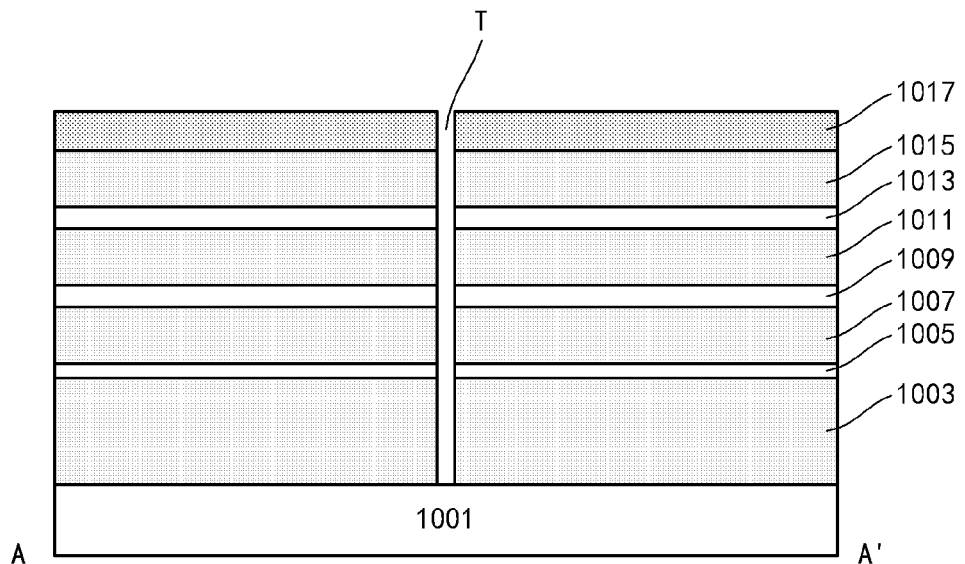

As shown in FIG. 2, a trench T may be formed in the above-mentioned layers formed on the substrate 1001. For example, a photoresist (not shown) may be formed on the hard mask layer 1017 and patterned by photolithography to have a linear opening extending in a first direction (a direction entering a paper surface in the drawing). Then, by using the photoresist as an etching mask, each layer may be selectively etched sequentially by, for example, reactive ion etching (RIE). The etching may stop at the substrate 1001. A size of the trench T may be determined according to a size of a fin in the semiconductor device to be formed. For example, the trench T may have a width (a dimension in a horizontal direction in the drawing) of about 5 nm-15 nm. The trench T defines a space in which the fin is formed.

Figure 3:
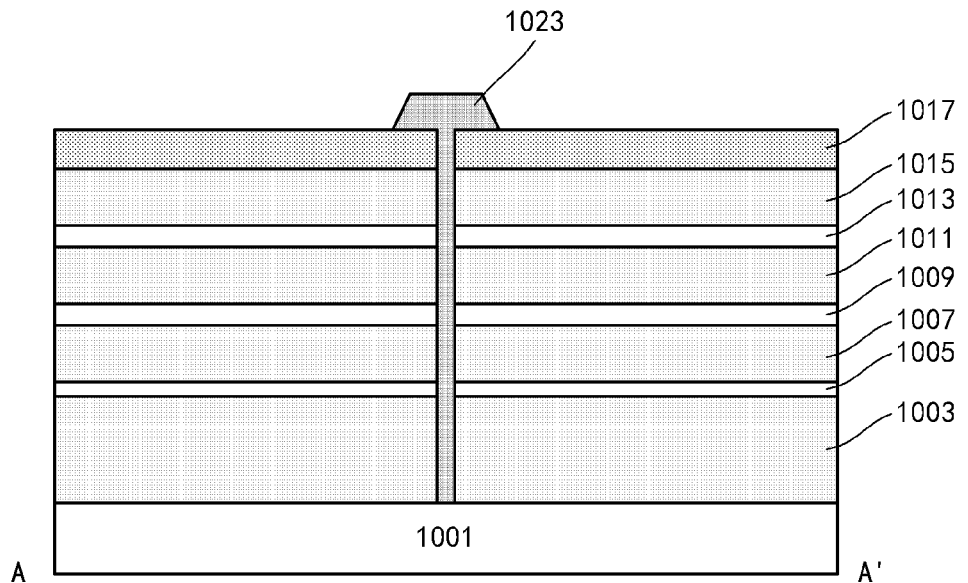
Figure 4:
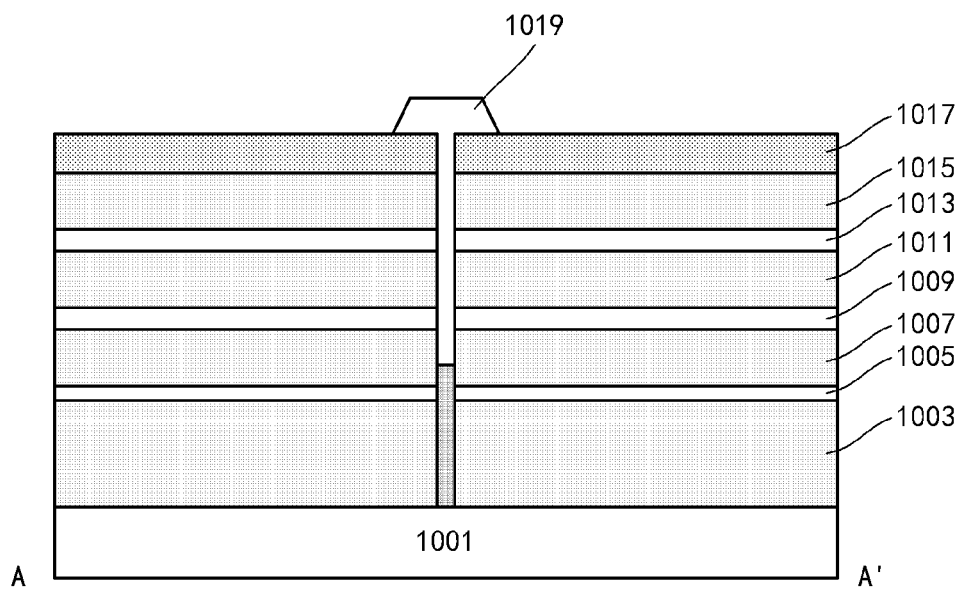

In order to suppress a leakage current, a punch through stopper (PTS) may be formed under the fin to be formed. That is, the PTS may be formed at a bottom of the trench T. For example, as shown in FIG. 3, a punch through stop layer 1023 may be formed in the trench T by epitaxial growth. The punch through stop layer 1023 may contain a semiconductor material such as Si, and is grown to completely fill the trench T. The punch through stop layer 1023 may be doped in situ, during the growth, to a conductivity type opposite to a conductivity type of the device to be formed. For example, for an n-type device, a p-type dopant such as B or In may be used, and for a p-type device, an n-type dopant such as As or P may be used. A doping concentration may be about 1E17-1E19 cm$^{-3}$. Annealing may be performed at a temperature of about 750-1050° C. to activate the dopant. Next, as shown in FIG. 4, the grown punch through stop layer 1023 may be planarized by, for example, chemical mechanical polishing (CMP). The CMP may stop at the hard mask layer 1017. The planarized punch through stop layer 1023 may be etched back to leave it at the bottom of the trench T to form the PTS. A top surface of the PTS may be lower than a bottom surface of a lowermost first active layer 1009 and higher than a top surface of the first sacrificial layer 1003, for example, it may be located between a top surface and a bottom surface of a lowermost second sacrificial layer 1007.

In an upper part of the trench T, a second active layer for the fin may be formed. For example, as shown in FIG. 4, a second active layer 1019 may be formed, in the trench T with the PTS formed at the bottom, by epitaxial growth. The second active layer 1019 may contain a semiconductor material such as Si, and is grown to completely fill the trench T. The second active layer 1019 may be doped in-situ during the growth so as to adjust the device threshold.

In this example, the first active layer and the second active layer may contain a same material (Si). However, the present disclosure is not limited to this. For example, the first active layer and the second active layer may contain different semiconductor materials, so that threshold voltages of the first portion and the second portion of the obtained channel portion may be adjusted to match each other. Additionally or alternatively, the first active layer and the second active layer may have different doping concentrations and/or doping impurities (for example, impurities of different conductivity types) in order to adjust the threshold voltages of the first portion and the second portion of the obtained channel portion. This is because, if considering a mechanical stability of the structure, the first active layer and the second active layer may have different thicknesses, which may cause the threshold voltages of the first portion and the second portion of the channel portion different or mismatched. In addition, a T-shaped structure formed by the first portion and the second portion may also affect an electric field distribution and thus affect the threshold voltages.

Figure 5:
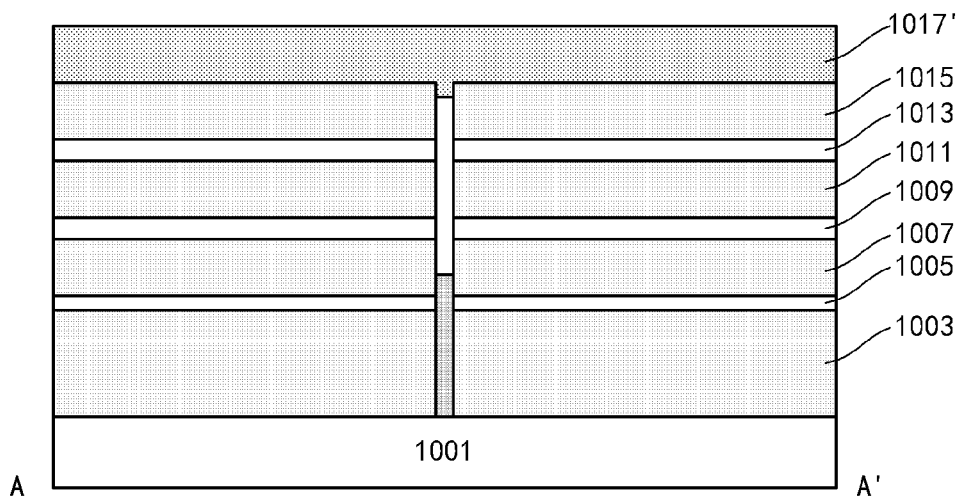

In the above operations, due to the formation of the trench T, an integrity of the hard mask layer 1017 is destroyed. For ease of subsequent patterning, the hard mask layer 1017 may be completed. As shown in FIG. 5, the grown second active layer 1019 may be planarized, by for example, CMP. The CMP may stop at the hard mask layer 1017. The planarized second active layer 1019 may be etched back so that a top surface thereof is concave to, for example, be close to and preferably not exceeding a top surface of the uppermost second sacrificial layer 1015. After that, an integrated hard mask layer 1017' may be formed through a process of deposition and then planarization.

Figure 6:
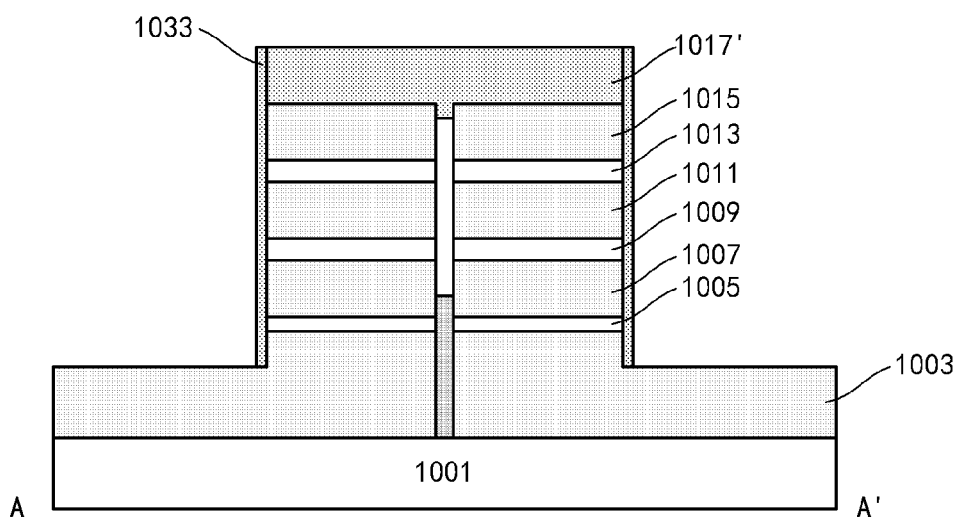

As shown in FIG. 6, the above-mentioned stacked layer and the hard mask layer 1017' may be patterned into a ridge-like structure to define the active region. For example, a photoresist (not shown) may be formed on the hard mask layer 1017' and patterned by photolithography as a bar shape extending in the first direction (the direction entering the paper surface in the drawing). The bar-shaped photoresist may cover a certain area extending from the second active layer 1019 to two sides in a second direction (a horizontal direction on the paper in the drawings) intersecting with (for example, perpendicular to) the first direction. Then, the photoresist may be used as an etching mask, to selectively etch each layer by, for example, RIE, to transfer a pattern of the photoresist to underlying layers. Thus, the stacked layer including the second sacrificial layers 1007, 1011, 1015 and the first active layers 1009, 1013 may form a ridge-like structure extending in the first direction. A size of the ridge-like structure to be formed may be determined according to a size of the nano-sheet in the semiconductor device to be formed.

In addition, the etch stop layer 1005 may be selectively etched by, for example, RIE, so as to expose the first sacrificial layer 1003 underneath. The exposed first sacrificial layer 1003 may be partially etched, so that a protection layer 1033 subsequently formed may completely cover the channel portion and sidewalls of the sacrificial gate stack. The protection layer 1033 may be formed on sidewalls of the ridge-like structure. For example, the protection layer 1033 may contain nitride. The protection layer 1033 may be formed by a spacer process, and therefore may exist on each vertical sidewall. It should be noted that if each layer (the first active layer and the second sacrificial layer) in the ridge-like structure may be substantially not etched by a following etching recipe they are exposed to (that is, have etching selectivity), then the protection layer 1033 may also be omitted.

Figure 7A:
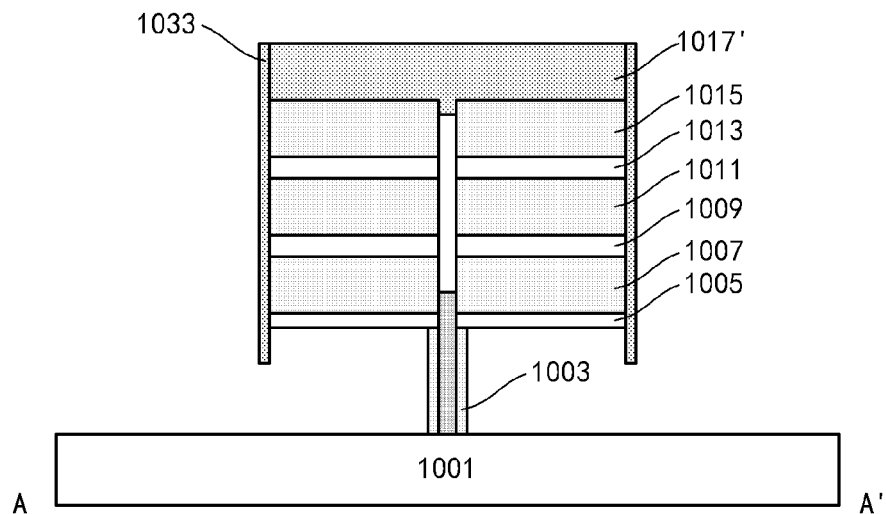
Figure 7B:
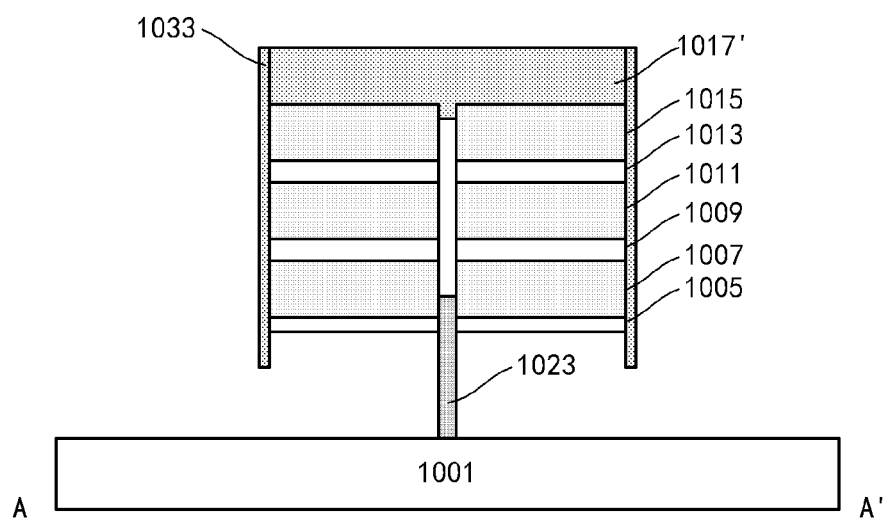

The first sacrificial layer 1003 may be selectively etched relative to the etch stop layer 1005 and the substrate 1001 of Si (and the protection layer 1033 of nitride) so as to at least partially remove the first sacrificial layer 1003. FIG. 7(*a*) shows a case where the first sacrificial layer 1003 remains on the sidewall of the PTS, and FIG. 7(*b*) shows a case where the first sacrificial layer 1003 is completely removed.

In this embodiment, the etch stop layer 1005 may help define a position of a lower surface of the gate stack to be formed subsequently or a position of an upper surface of the isolation layer to be formed subsequently. However, the present disclosure is not limited to this. If the first sacrificial layer 1003 contains a material having etching selectivity with respect to the second sacrificial layers 1007, 1011, 1015, the etch stop layer 1005 may be omitted.

Figure 8A:
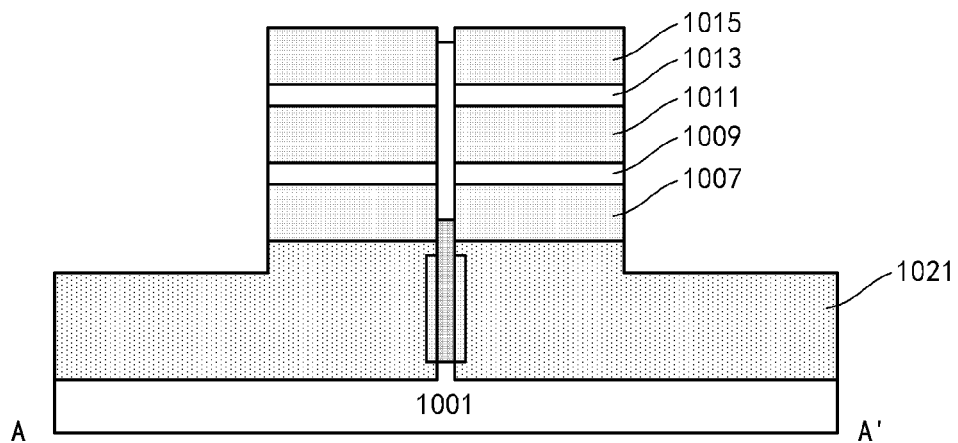
Figure 8B:
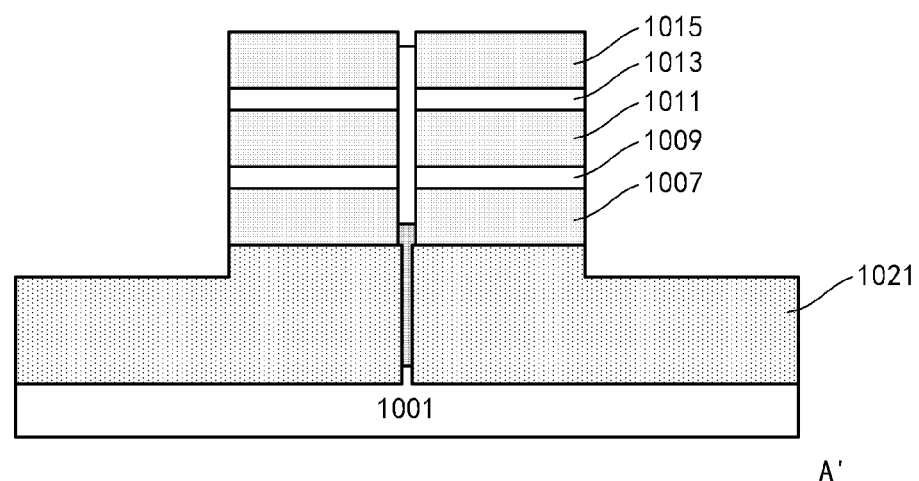

As shown in FIGS. 8(*a*) and 8(*b*), an isolation layer 1021 may be formed on the substrate 1001. In the case where the etch stop layer 1005 is formed, in order to reduce a capacitance between a gate conductor to be formed later and the substrate 1001, the etch stop layer 1005 may be removed by selective etching. In this example, since both the etch stop layer 1005 and the substrate 1001 contain Si, the substrate 1001 may also be etched when the etch stop layer 1005 is selectively etched. FIG. 8(*a*) shows a case corresponding to FIG. 7(*a*), in which the PTS may be substantially not affected by the etching due to the existence of the first sacrificial layer 1003 on the sidewalls. FIG. 8(*b*) shows a case corresponding to FIG. 7(*b*), in which the sidewalls of the PTS are exposed to the etching recipe so that it may be partially etched. After that, the hard mask layer 1017 and the protection layer 1033 of nitride may be removed by selective etching such as wet etching using hot phosphoric acid. The isolation layer 1021 may be formed by depositing a dielectric material such as oxide and then etching it back. The etching back may be selective etching, such as wet etching or dry etching using a HF solution, a vapor phase HF or a BOE solution, etc. After the etching back, a part of the isolation layer 1021 at a periphery of the ridge-like structure may have a top surface lower than a top surface of a part of the isolation layer 1021 located under the ridge structure.

Hereinafter, the case shown in FIG. 8(*a*) is mainly described by way of example.

Figure 9:
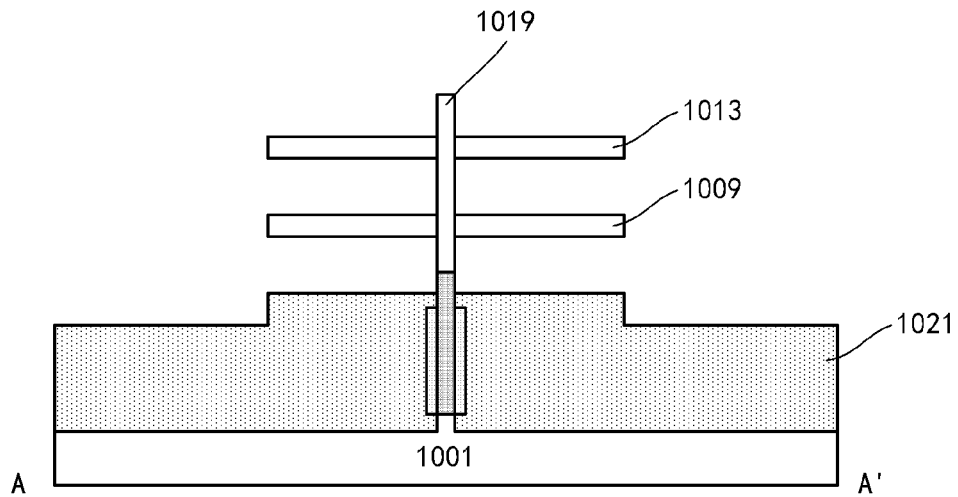

As shown in FIG. 9, the second sacrificial layers 1007, 1011, 1015 of SiGe may be selectively etched relative to the first active layers 1009, 1013 and the second active layer 1019 of Si (and the isolation layer 1021 of oxide), so as to remove the second sacrificial layers 1007, 1011, 1015. In this way, a tree-shaped structure is obtained. As shown in FIG. 9, the tree-shaped structure includes a first portion 1019 extending in the vertical direction and second portions 1009, 1013 extending from the first portion 1019 to two opposite sides in the lateral direction. In this example, there are two second portions on each opposite side of the first portion 1019, respectively. However, the present disclosure is not limited to this. The number of the second portions may be more (for example, three 3 or more) or less (for example, one).

According to the above method, the second portions on two opposite sides of the first portion 1019 may appear in pairs and may be symmetrical about the first portion 1019. However, the present disclosure is not limited to this. For example, due to fluctuations in the process, or for the purpose of structural adjustment, a part of branches, that is, the second portions in the tree-shaped structure, may also be missing.

Figure 10:
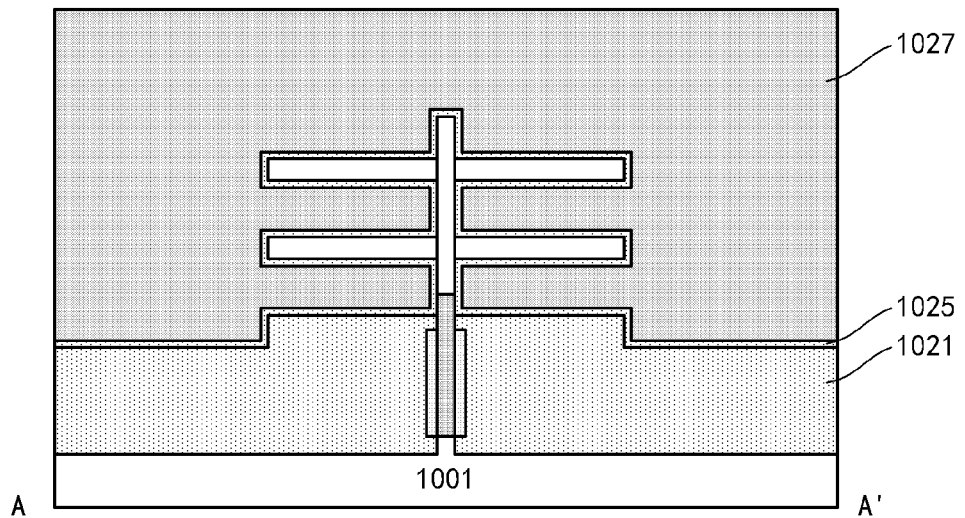
Figure 11A:
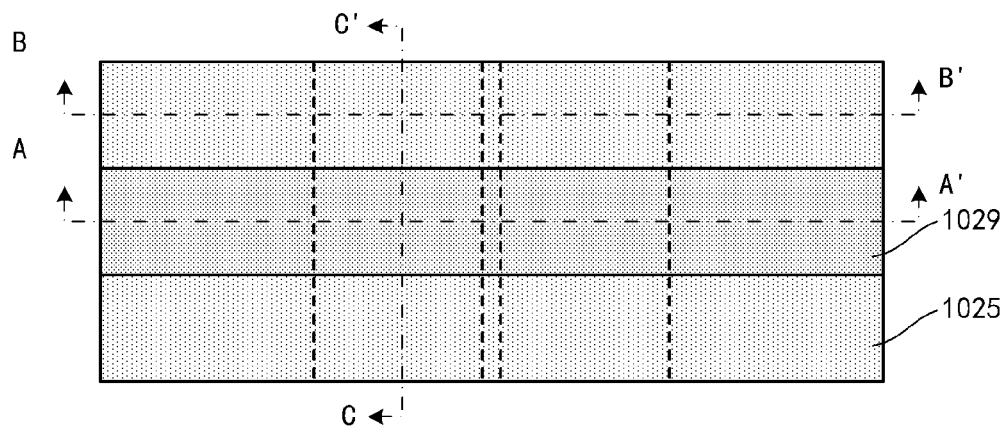
FIGS. 11(a) and 13(a) are top views.
Figure 11B:
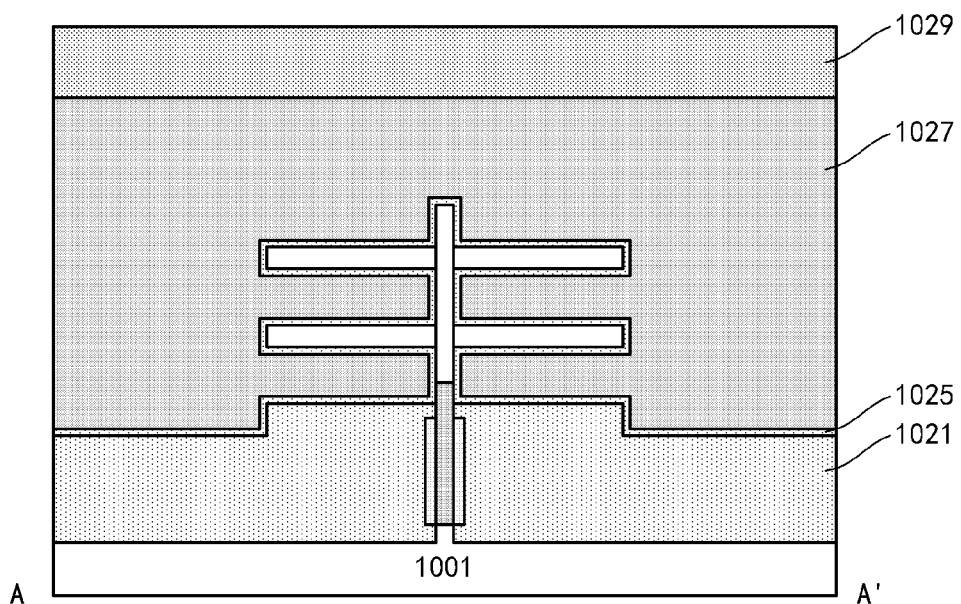
Figure 11C:
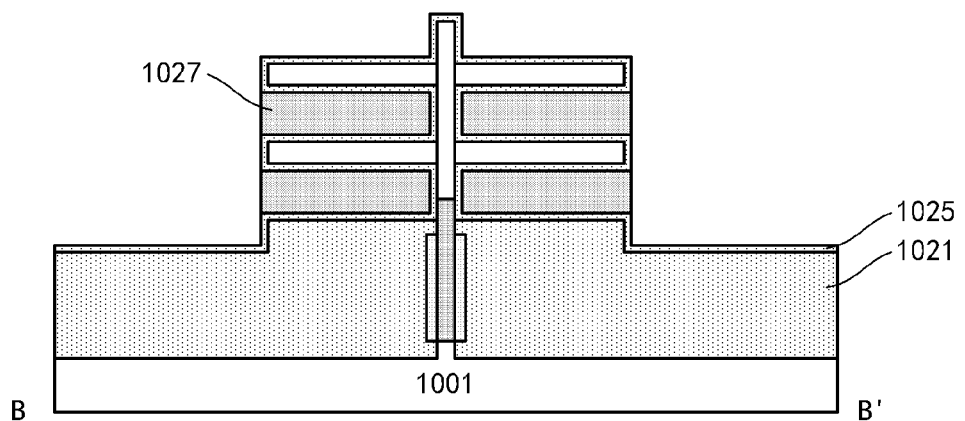
Figure 11D:
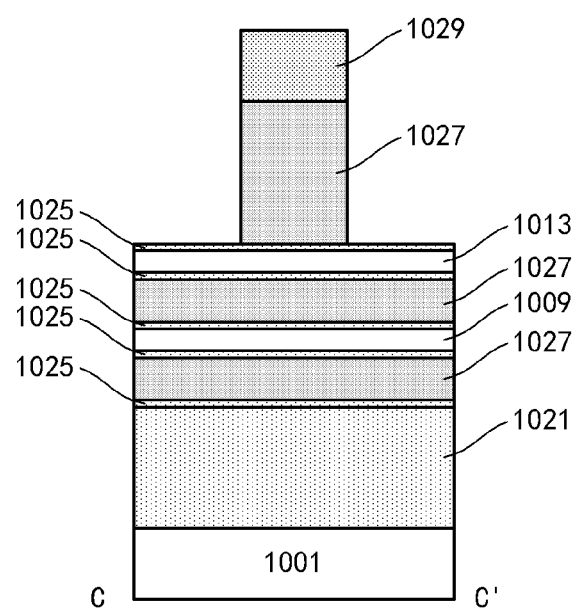

As shown in FIG. 10, a sacrificial gate stack may be formed on the isolation layer 1021. The sacrificial gate stack may include a sacrificial gate dielectric layer 1025 and a sacrificial gate conductor layer 1027. The sacrificial gate dielectric layer 1025 may contain oxide, and may be formed by, for example, deposition or thermal oxidation. The sacrificial gate conductor layer 1027 may contain polycrystalline SiGe (a Ge atomic percentage is about 10%-40%), and may be formed by, for example, deposition and then planarization such as CMP. Due to the removal of the second sacrificial layer, the formed sacrificial gate stack formed may surround each of the first active layers 1009, 1013 and the second active layer 1019. In this example, both the sacrificial gate dielectric layer 1025 and the isolation layer 1021 contain oxide, and they may therefore appear to be integrated.

As shown in FIGS. 11(*a*) to 11(*d*), the sacrificial gate stack may be patterned into a bar shape extending in the second direction. Specifically, a hard mask layer 1029 may be formed on the sacrificial gate stack. The hard mask layer 1029 may contain nitride and have a thickness of, for example, about 15 nm to 150 nm. A photoresist (not shown) may be formed on the hard mask layer 1029 and patterned by photolithography into a bar shape extending in the second direction (refer to the top view shown in FIG. 11(*a*)). Next, by using the photoresist as an etching mask, the hard mask layer 1029 and the sacrificial gate conductor layer 1027 may be selectively etched sequentially by, for example, RIE. The selective etching may stop at the sacrificial gate dielectric layer 1025 of oxide.

Referring to FIG. 11(*c*), on two opposite sides of the bar-shaped hard mask layer 1029 extending in the second direction in the first direction (that is, the upper and lower sides of the bar-shaped hard mask layer 1029 in the top view shown in FIG. 11(*a*)), due to the existence of the first active layers, parts of the sacrificial gate conductor layer 1027 located under each first active layer may be left.

Figure 12A:
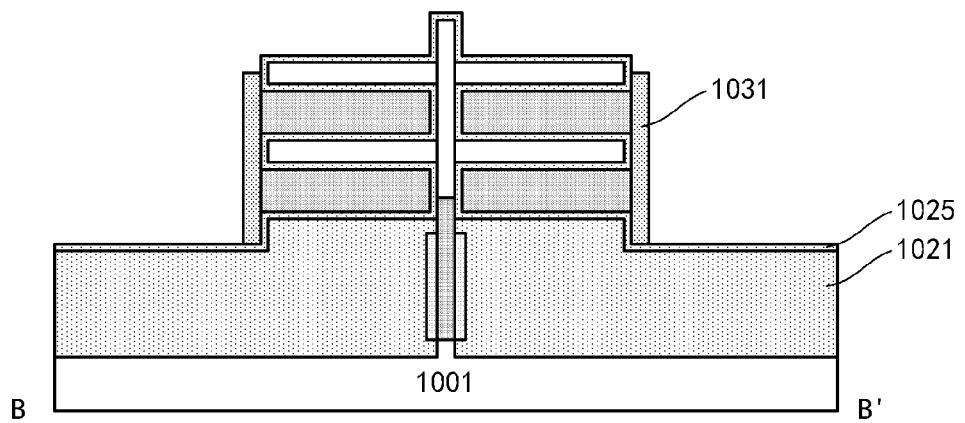
Figure 12B:
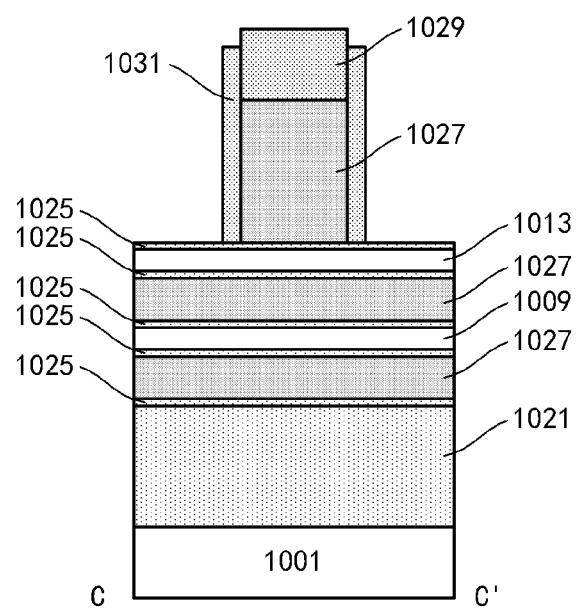

As shown in FIGS. 12(*a*) and 12(*b*), a first spacer 1031 may be formed on a sidewall of the sacrificial gate stack. For example, a layer of nitride with a thickness of about 1 nm-3 nm may be deposited in a substantially conformal manner, and then the deposited nitride layer may be anisotropically etched in the vertical direction to remove a lateral extension part thereof and leave a vertical extension part thereof, thereby obtaining the first spacer 1031. Before depositing the nitride layer, an etch stop layer may be formed by, for example, deposition, and the etching of the nitride layer may stop at the etch stop layer. Since the ridge-like structure (currently including the first active layers, the second active layer, and the remaining sacrificial gate stack) also has vertical sidewalls, the first spacer may also be formed on the sidewall of the ridge structure, as shown in FIG. 12(*a*).

Figure 13A:
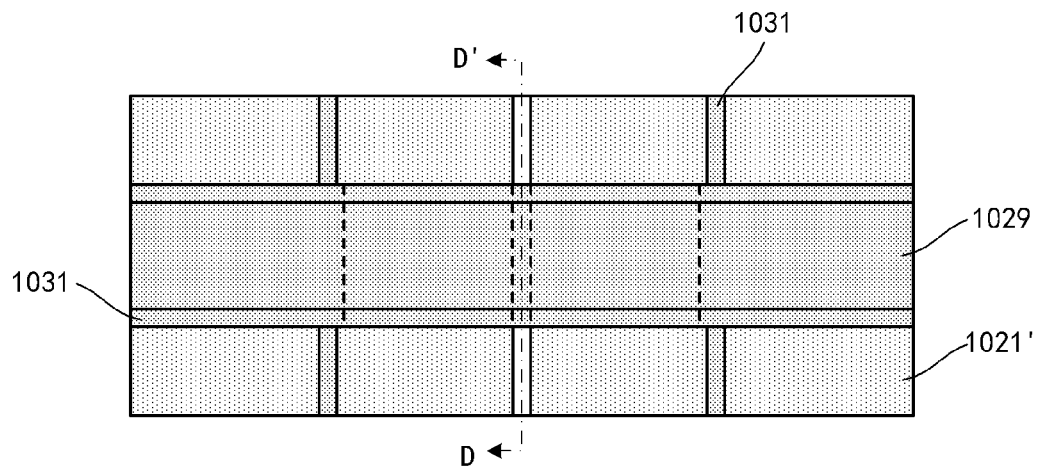
Figure 13B:
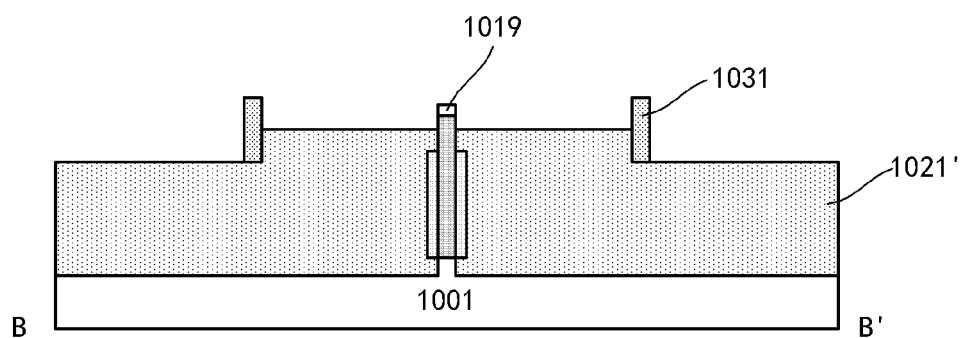
Figure 13C:
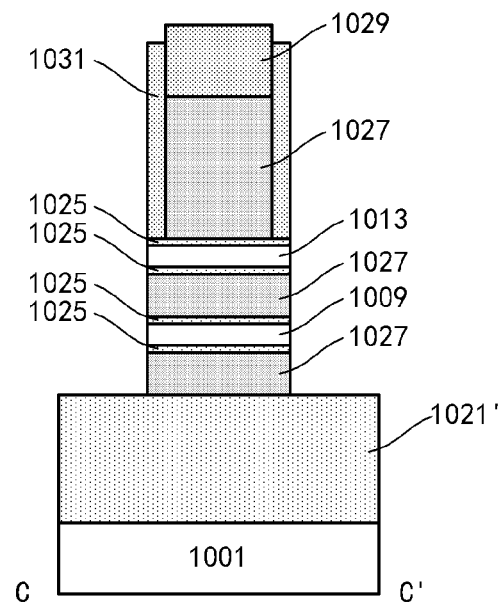

As shown in FIGS. 13(*a*) to 13(*c*), parts of the first active layers and the second active layer on two sides of the bar-shaped hard mask layer 1029 and the first spacers 1031 on the sidewalls of the bar-shaped hard mask layer 1029 may be removed. For example, referring to FIG. 13(*a*) and FIG. 13(*b*), the sacrificial gate dielectric layer 1025, the first active layer 1013, the sacrificial gate dielectric layer 1025, the sacrificial gate conductor layer 1027, the sacrificial gate dielectric layer 1025, the first active layer 1009, the sacrificial gate dielectric layer 1025 and the sacrificial gate conductor layer 1027 may be selectively etched sequentially by, for example, RIE. In this way, the sacrificial gate stack may be formed into a bar shape extending in the second direction corresponding to the hard mask layer 1029. Due to the above process, a part of the ridge-like structure under the sacrificial gate stack and the first spacers formed on the sidewalls of the sacrificial gate stack is remained, and parts of the ridge-like structure on two sides of the sacrificial gate stack and the first spacers are removed, so that a first spacer on the sidewall thereof is at least partially removed during the etching process due to a loss of support, although no separate etching process is performed for the first spacer of nitride. In addition, the tree-shaped structure may also remain under the sacrificial gate stack and the first spacers formed on the sidewalls thereof to form a tree-shaped channel portion. The second portion of the channel portion, that is, each first active layer, may have substantially a same shape and may be substantially aligned in the vertical direction. In this example, as shown in FIG. 13(*b*), on two sides of the sacrificial gate stack and the first spacer, a certain thickness of the second active layer 1019 may remain on a top surface of the PTS. In addition, the isolation layer 1021 may also be affected by the etching, and it is shown here together with the adjacent sacrificial gate dielectric layer (if the sacrificial gate dielectric layer still exists after the etching process) as 1021' in this example, both the isolation layer and the sacrificial gate dielectric layer are oxide).

As shown in FIG. 13(*c*), sidewalls of the tree-shaped channel portion in the first direction are currently exposed to the outside. Next, source/drain portions connected to the exposed sidewalls of the channel portion may be formed on two sides of the sacrificial gate stack (and the first spacers on the sidewall thereof).

Figure 14A:
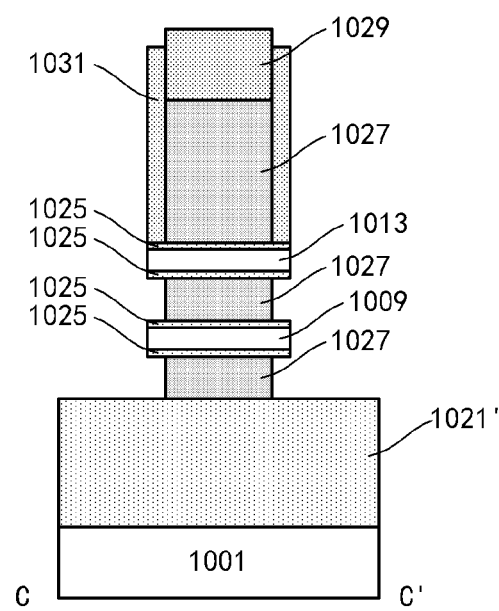
Figure 14B:
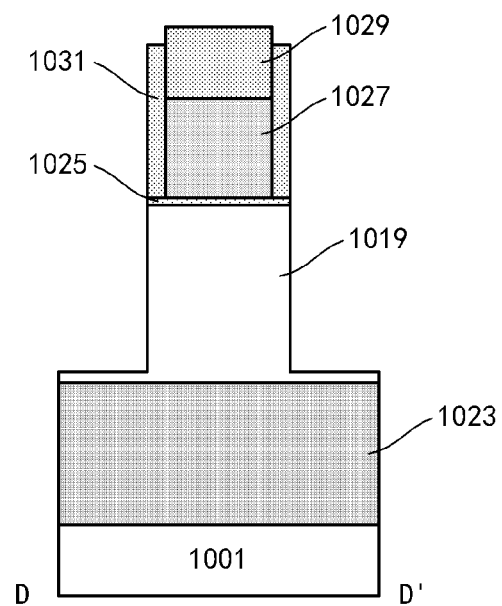
FIGS. 14(b), 16(d), 17(d), 18(d) are cross-sectional views taken along line DD'.
Figure 15:
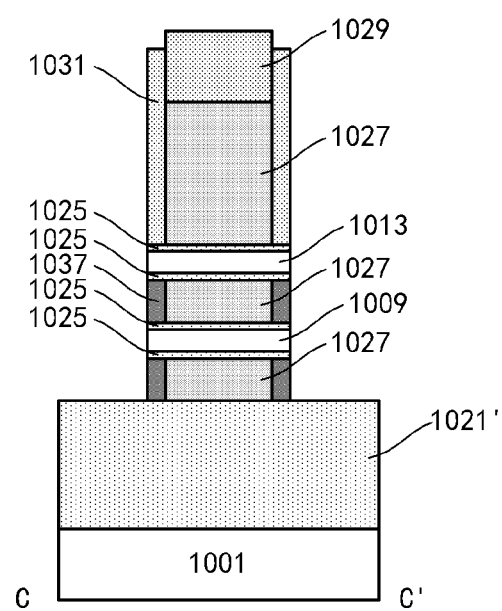

In order to reduce a capacitance subsequently formed between the gate stack and the source/drain portions, a dielectric may be further inserted between the gate stack and the source/drain portions. Therefore, as shown in FIGS. 14(*a*) and 14(*b*), the sacrificial gate conductor layer 1027 may be selectively etched (which may be isotropic etching here) so as to be relatively recessed. Here, atomic layer etching (ALE) may be used to better control an etching depth. A degree of recession of the sacrificial gate conductor layer 1027 may be approximately the same at each position. Then, as shown in FIG. 15, a second spacer 1037 may be formed on sidewall of the sacrificial gate conductor layer 1027 that is relatively recessed. The second spacer 1037 may be formed by a process of deposition and then etching back. Therefore, an outer sidewall of the second spacer 1037 may be substantially aligned with an outer sidewall of the first spacer 1031. For example, the second spacer 1037 may contain a low-k dielectric material such as SiC. According to the embodiments of the present disclosure, the etching depth of the sacrificial gate conductor layer 1027 may be controlled so that a thickness of the second spacer 1037 formed is substantially the same as the thickness of the first spacer 1031. In this way, the sacrificial gate stack (and the gate stack formed thereafter) may have substantially a same gate length on upper and lower sides of the first active layers.

As shown in FIGS. 16(a) to 16(d), a source/drain portion 1039 may be formed by, for example, epitaxial growth. The source/drain portion 1039 may be grown from the exposed surface of each first active layer and second active layer. The source/drain portion 1039 may be doped in situ, during the growth, to a conductivity type corresponding to a conductivity type of the device to be formed, for example, n-type for an n-type device and p-type for a p-type device. The grown source/drain portion 1039 may contain a different material from the channel portion (for example, with a different lattice constant) so as to apply stress to the channel portion. For example, for an n-type device, the source/drain portion 1039 may contain Si:C (C atomic percentage is, for example, about 0.5%-3%), and for a p-type device, the source/drain portion 1039 may contain SiGe (Ge atomic percentage is, for example, about 10%-75%).

Figure 16A:
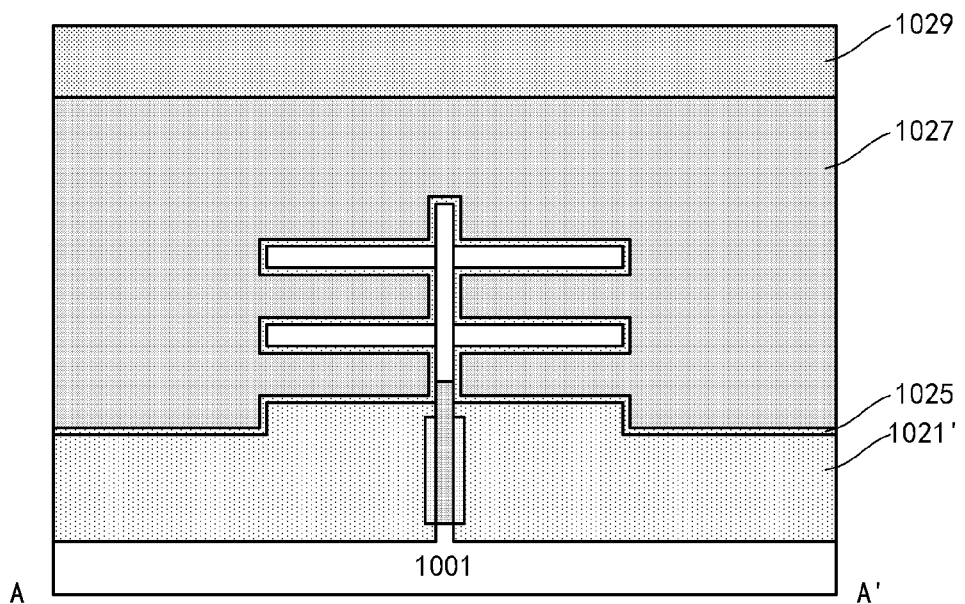
Figure 16B:
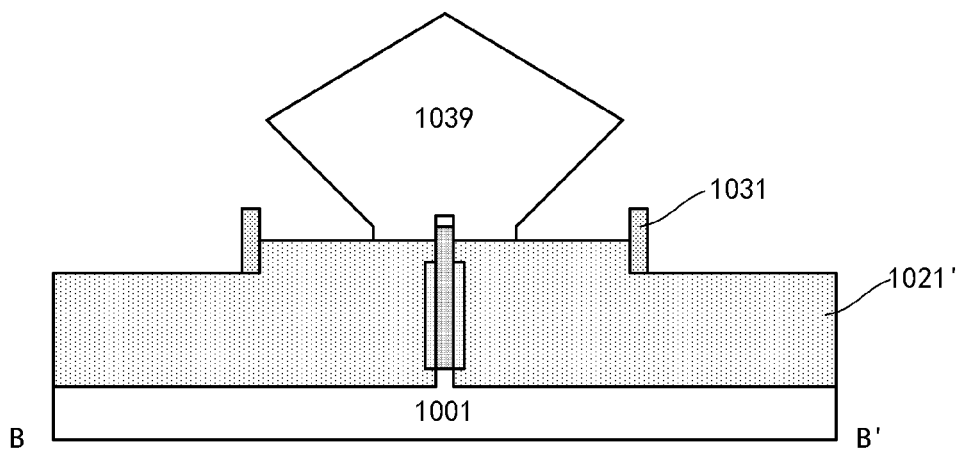
Figure 16C:
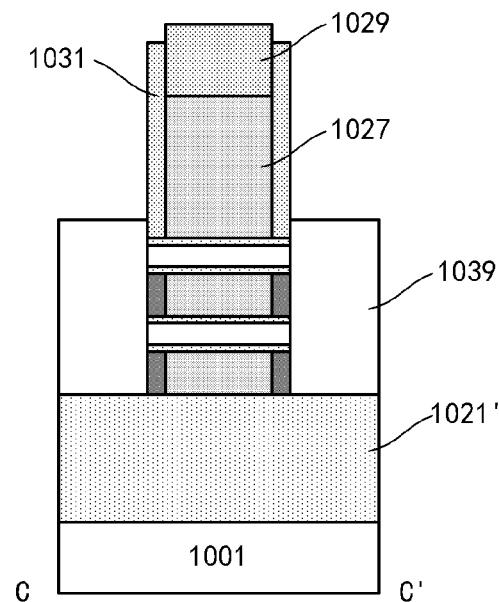
Figure 16D:
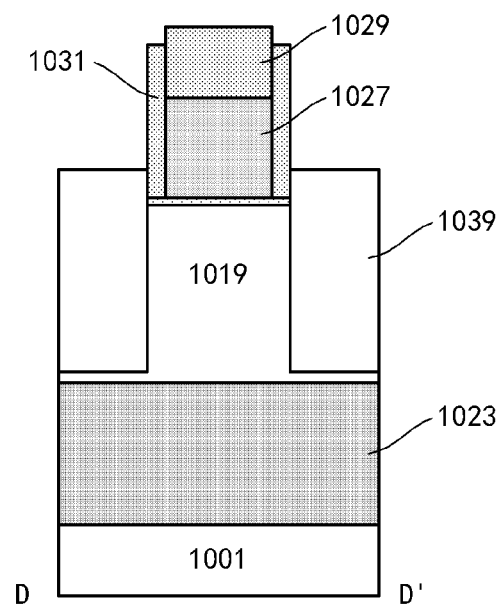
Figure 17A:
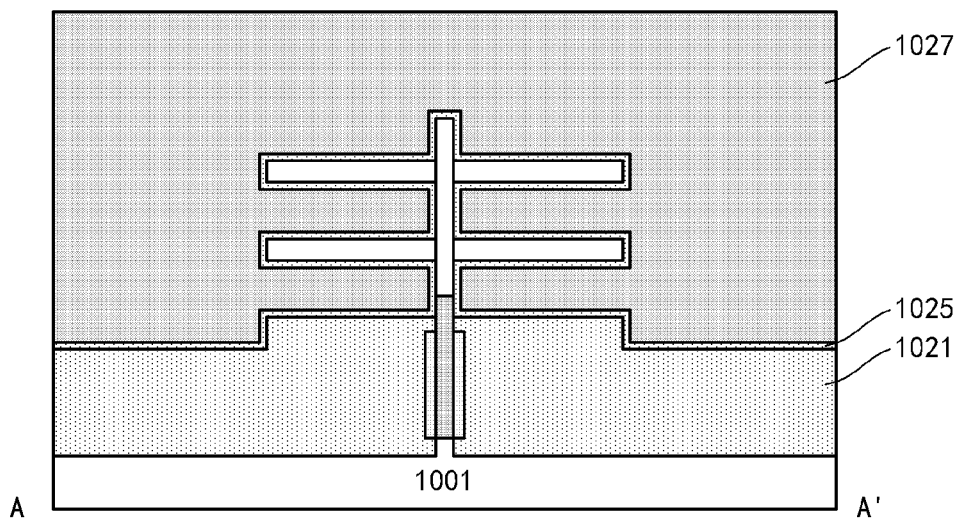
Figure 17B:
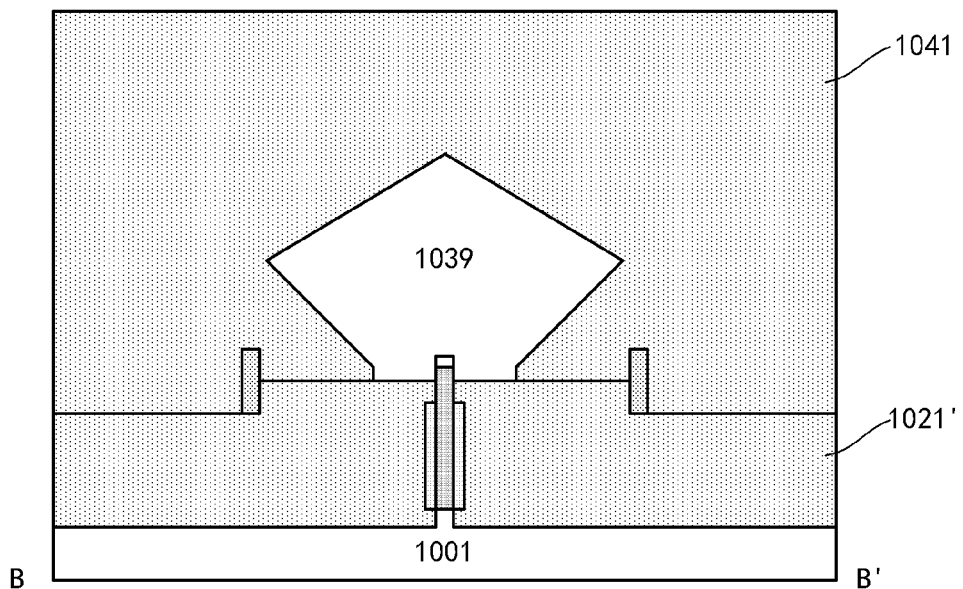
Figure 17C:
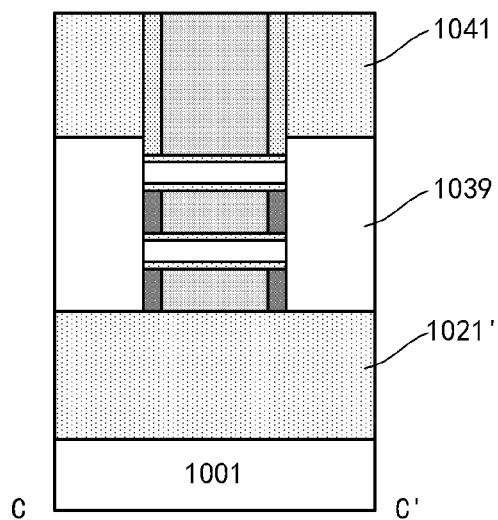
Figure 17D:
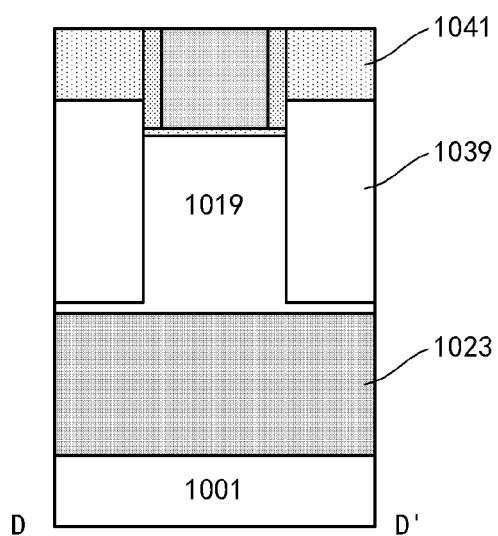

On two opposite sides of the sacrificial gate stack, the source/drain portions 1039 are formed as a whole. As shown in FIG. 16(c), each first active layer in the form of nanosheets is connected between the source/drain portions 1039 on two opposite sides, so as to form the second portion of the channel portion, which is similar to an MBCFET. In addition, as shown in FIG. 16(d), the second active layer 1019 is connected between the source/drain portions 1039 on two opposite sides, so as to form the second portion of the channel portion, which is similar to a FinFET.

Next, a replacement gate process may be performed to complete the manufacture of the device.

As shown in FIGS. 17(a) to 17(d), an interlayer dielectric layer 1041 may be formed on the substrate 1001 by, for example, depositing a dielectric material such as oxide, so as to cover the sacrificial gate stack, the source/drain portions 1039 and the isolation layer 1021. The interlayer dielectric layer 1041 may be planarized by, for example, CMP, so as to expose the sacrificial gate conductor layer 1027.

As shown in FIGS. 18(a) to 18(d), the sacrificial gate conductor layer 1027 and the sacrificial gate dielectric layer 1025 may be removed by selective etching, thereby forming a space inside the first spacers 1031 and the second spacers 1037. A gate stack may be formed in the space. For example, a gate dielectric layer 1043 and a gate conductor layer 1045 may be sequentially formed by a process of deposition and then planarization such as CMP. The gate dielectric layer 1043 may be formed in a substantially conformal manner, with a thickness of, for example, about 2-5 nm, and may include a high-k gate dielectric such as $HfO_2$. Before the high-k gate dielectric is formed, an interface layer, for example, a layer of oxide formed by an oxidation process or deposition process such as atomic layer deposition (ALD) may be formed on the surface of the channel portion, with a thickness of about 0.2-2 nm. The gate conductor layer 1045 may contain a work function adjustment metal such as TiN, TaN, etc. and a gate conductive metal such as W, etc.

Figure 18A:
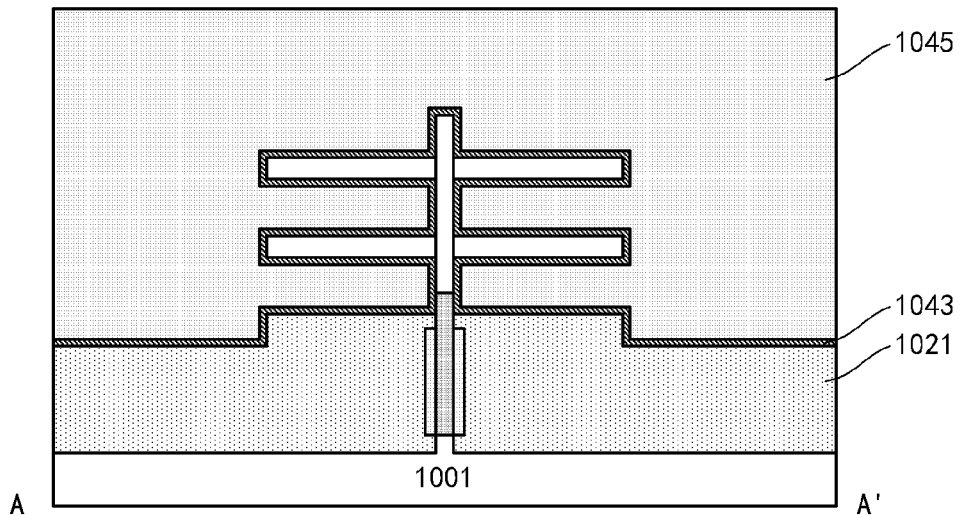
Figure 18B:
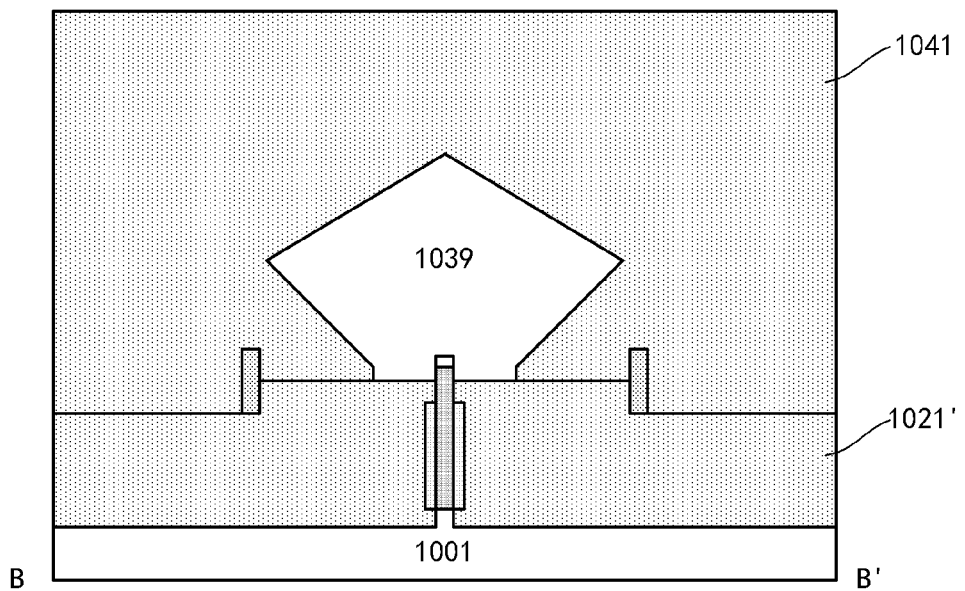
Figure 18C:
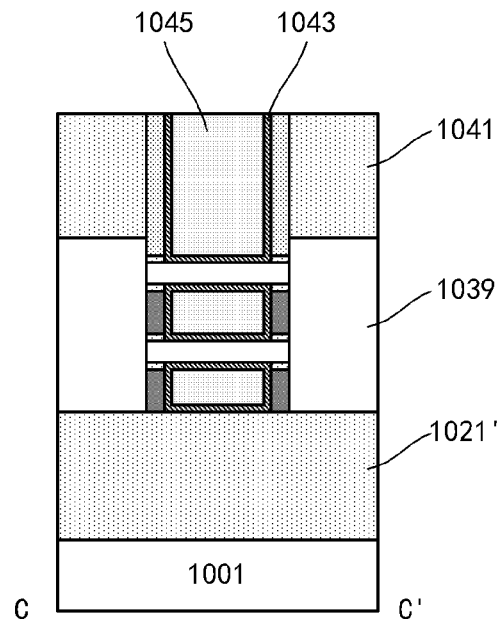
Figure 18D:
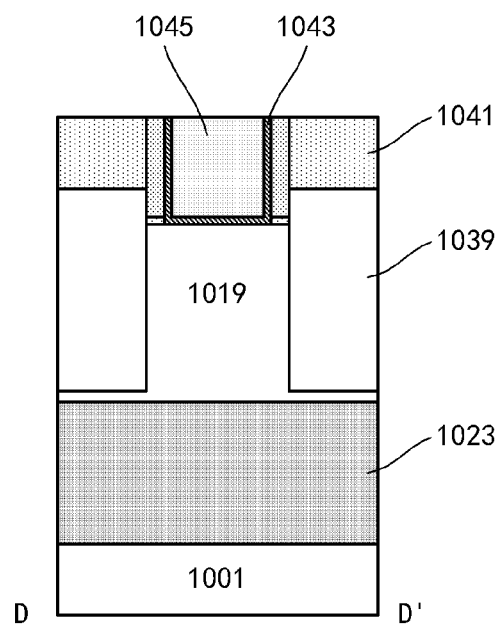
Figure 19A:
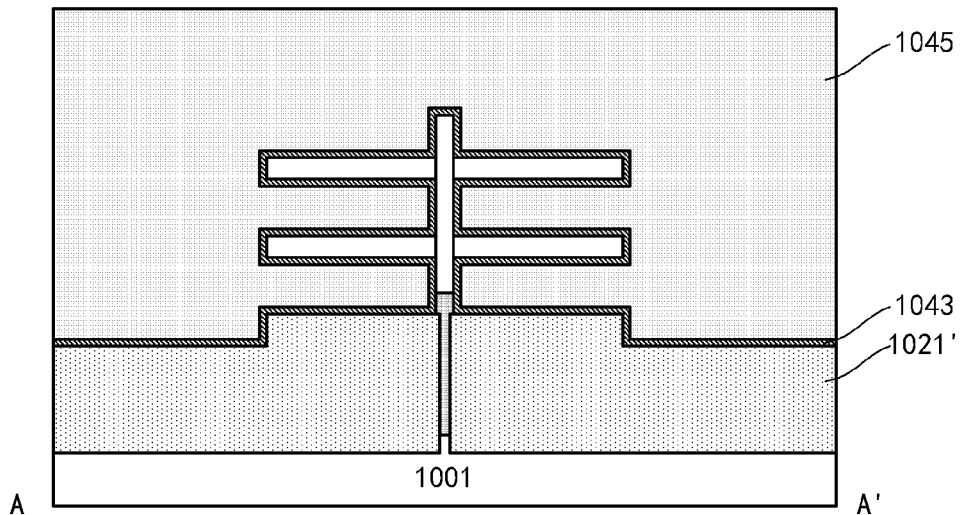
Figure 19B:
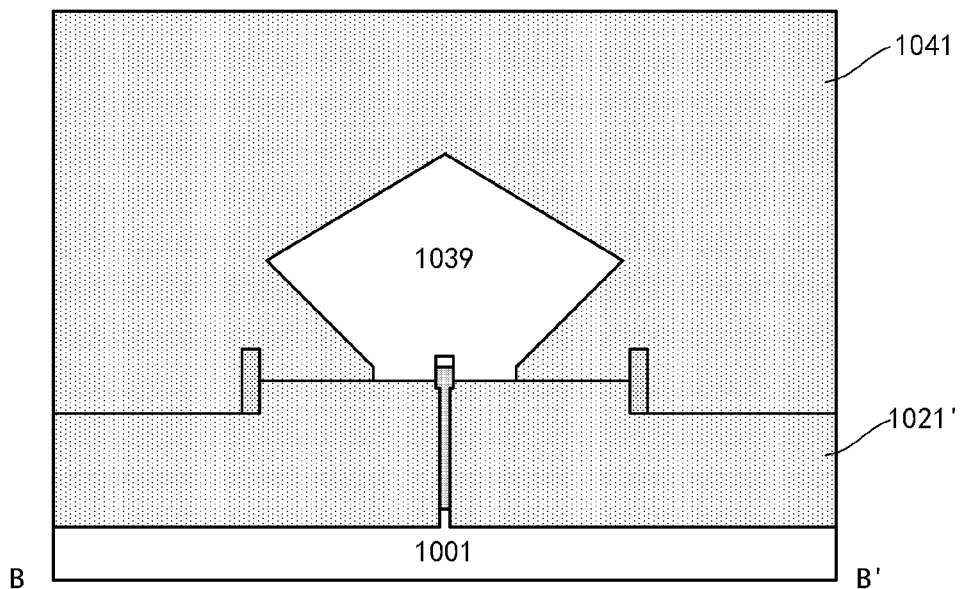

FIGS. 19(a) and 19(b) show an embodiment corresponding to the case shown in FIG. 18(b). Except for the shape of the PTS and an absence of the first sacrificial layers on the sidewalls of the PTS, other aspects of this embodiment may be the same as those shown in FIGS. 18(a) to 18(d).

The semiconductor device according to the embodiments of the present disclosure is applicable to various electronic apparatuses. For example, an integrated circuit (IC) may be formed based on such semiconductor device, and thereby an electronic apparatus may be constructed. Therefore, the present disclosure further provides an electronic apparatus including the above-mentioned semiconductor device. The electronic apparatus may further include a display screen matched with the integrated circuit, a wireless transceiver matched with the integrated circuit, and other components. The electronic apparatus may be, for example, a smart phone, a computer, a tablet computer (PC), a wearable smart device, a mobile power supply, and so on.

According to the embodiments of the present disclosure, there is further provided a method of manufacturing a system on chip (SoC), which may include the above-mentioned manufacturing method. Specifically, a variety of devices may be integrated on a chip, and at least some of the devices are manufactured according to the method of the present disclosure.

In the above descriptions, technical details such as patterning and etching of each layer have not been described in detail. However, those skilled in the art should understand that various technical means may be used to form layers and regions of desired shapes. In addition, in order to form the same structure, those skilled in the art may also design a method that is not completely the same as the method described above. In addition, although the embodiments are described above separately, this does not mean that the measures in each embodiment cannot be advantageously used in combination.

The embodiments of the present disclosure have been described above. However, these embodiments are for illustrative purposes only, and are not intended to limit the scope of the present disclosure. The scope of the present disclosure is defined by the appended claims and their equivalents. Without departing from the scope of the present disclosure, those skilled in the art may make various substitutions and modifications, and these substitutions and modifications should all fall within the scope of the present disclosure.

What is claimed is:

1. A semiconductor device, comprising:
    a channel portion, comprising:
        a first portion extending in a vertical direction with respect to a substrate; and
        a second portion extending from the first portion to two opposite sides in a lateral direction with respect to the substrate, respectively;
    source/drain portions connected to the channel portion on two opposite sides of the channel portion; and
    a gate stack intersecting with the channel portion.

2. The semiconductor device according to claim 1, wherein the channel portion comprises a plurality of second portions on two opposite sides of the first portion, and on each side of the first portion each second portion is spaced apart from each other in the vertical direction.

3. The semiconductor device according to claim 2, wherein the plurality of second portions have substantially a same shape, and are substantially aligned in the vertical direction.

4. The semiconductor device according to claim 1, wherein the second portions of the channel portion on two opposite sides of the first portion of the channel portion are provided in pairs.

5. The semiconductor device according to claim 1, wherein the channel portion contains a single crystal semiconductor material;
   wherein a crystal interface exists in at least one of a position between the first portion of the channel portion and the source/drain portion, a position between the second portion of the channel portion and the source/drain portion, and a position between the first portion and the second portion of the channel portion;
   wherein the first portion is formed as a fin, and the second portion is formed as a nano-sheet.

6. The semiconductor device according to claim 1, further comprising:
   a spacer formed on a sidewall of the gate stack, wherein a sidewall of the spacer facing each source/drain portion is substantially coplanar in the vertical direction.

7. The semiconductor device according to claim 6, wherein the spacer comprises:
   a first part extending on two sides of the channel portion and on an uppermost second portion of the channel portion; and
   a second part extending between each second portion of the channel portion and between a lowest second portion of the channel portion and the substrate,
   wherein, the first part and the second part of the spacer contain different materials.

8. The semiconductor device according to claim 1, wherein the gate stack extends on upper and lower surfaces of each second portion, and a sidewall of a portion of the gate stack extending on the upper surface of each second portion is substantially aligned with, in the vertical direction, a sidewall of a portion of the gate stack extending on the lower surface of the corresponding second portion;
   wherein a sidewall of a portion of the gate stack intersecting with the second portion of the channel portion is substantially in connection with a sidewall of a portion of the gate stack intersecting with the first portion of the channel portion.

9. The semiconductor device according to claim 1, wherein a top surface of the first portion of the channel portion is higher than a top surface of an uppermost second portion;
   wherein the device further comprises: an isolation layer formed on the substrate, wherein the gate stack is formed on the isolation layer.

10. The semiconductor device according to claim 9, further comprising:
    a punch through stopper located under the first portion of the channel portion, wherein the isolation layer surrounds the punch through stopper.

11. The semiconductor device according to claim 10, wherein the punch through stopper is a semiconductor connected to the substrate.

12. The semiconductor device according to claim 11, wherein, the semiconductor device is an n-type device, and the semiconductor of the punch through stopper is a p-type doped semiconductor; or
    the semiconductor device is a p-type device, and the semiconductor of the punch through stopper is an n-type doped semiconductor;
    wherein at least a lower part of the semiconductor has a reduced thickness relative to the first portion of the channel portion.

13. The semiconductor device according to claim 1, wherein the first portion and the second portion of the channel portion contain different semiconductor materials;
    wherein the first portion and the second portion of the channel portion have different doping concentrations and/or doping impurities;
    wherein at least one second portion on one side of the first portion of the channel portion is substantially coplanar with a corresponding second portion on the other side.

14. The semiconductor device according to claim 13, wherein each second portion on one side of the first portion of the channel portion is substantially coplanar with a corresponding second portion on the other side.

15. An electronic apparatus, comprising the semiconductor device according to claim 1, wherein the electronic apparatus comprises a smart phone, a computer, a tablet computer, an artificial intelligence device, a wearable device, or a mobile power supply.

* * * * *